(12) United States Patent
Ito et al.

(10) Patent No.: US 12,204,243 B2
(45) Date of Patent: Jan. 21, 2025

(54) IMPRINT METHOD, IMPRINT APPARATUS, AND ARTICLE MANUFACTURING METHOD

(71) Applicant: CANON KABUSHIKI KAISHA, Tokyo (JP)

(72) Inventors: Masato Ito, Utsunomiya (JP); Yoshinari Someya, Shioya-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 407 days.

(21) Appl. No.: 17/026,430

(22) Filed: Sep. 21, 2020

(65) Prior Publication Data

US 2021/0096462 A1    Apr. 1, 2021

(30) Foreign Application Priority Data

Oct. 1, 2019   (JP) .................................. 2019-181192

(51) Int. Cl.
  *G03F 7/00*   (2006.01)
  *G03F 9/00*   (2006.01)

(52) U.S. Cl.
  CPC .......... *G03F 7/0002* (2013.01); *G03F 9/7042* (2013.01)

(58) Field of Classification Search
  CPC ... G03F 7/0002; G03F 9/7042; G03F 7/70683
  See application file for complete search history.

(56) References Cited

U.S. PATENT DOCUMENTS

| 2009/0147237 A1 | 6/2009 | Schumaker |
| 2010/0189839 A1* | 7/2010 | Sano ................ B29C 59/02 425/174.4 |

(Continued)

FOREIGN PATENT DOCUMENTS

| JP | H0513292 A | 1/1993 |
| JP | 2011509516 A | 3/2011 |

(Continued)

OTHER PUBLICATIONS

Office Action issued in Korean Patent Application No. 10-2020-0119581 mailed Aug. 5, 2024. English translation provided.

*Primary Examiner* — Tabassom Tadayyon Eslami
(74) *Attorney, Agent, or Firm* — ROSSI, KIMMS & McDOWELL LLP

(57) ABSTRACT

In order to provide a method for shortening acquisition of illumination conditions, an imprint method for forming a pattern on an imprint material R supplied onto a substrate W using a mold includes: performing a first illumination process of illuminating a mold mark Mmark formed on the mold M and a substrate mark Wmark formed in each of a plurality of first shot regions on the substrate W and adjusting each of illumination conditions in a state in which the mold M and the imprint material R supplied to each of the plurality of first shot regions are brought into contact with each other; and performing a deriving process of deriving approximate illumination conditions indicating illumination conditions for a second shot region that is different from the plurality of first shot regions, on the basis of each of the illumination conditions for the plurality of first shot regions adjusted in the first illumination process.

16 Claims, 7 Drawing Sheets

(56) References Cited

U.S. PATENT DOCUMENTS

2012/0217675 A1* 8/2012 Usui .................. B82Y 10/00
264/293
2016/0363874 A1* 12/2016 Matsumoto .......... G03F 7/0002

FOREIGN PATENT DOCUMENTS

| JP | 2011233744 A | 11/2011 |
| JP | 2017-183364 | * 5/2017 |
| JP | 2017183364 A | 10/2017 |
| JP | 2018152374 A | 9/2018 |

* cited by examiner

IMPRINT METHOD, IMPRINT APPARATUS, AND ARTICLE MANUFACTURING METHOD

BACKGROUND OF THE INVENTION

Field of the Invention

The present invention relates to an imprint method, an imprint apparatus, and an article manufacturing method.

Background of the Invention

An imprint technique of bringing a mold into contact with an imprint material on a substrate to form a minute pattern is known. Also, one imprint technique is a light-curing method using a light-curable resin as an imprint material. In an imprint apparatus employing a light-curing method, first, an imprint material is supplied onto a substrate. Next, a pattern of a mold is pressed against the imprint material on the substrate. Then, after the imprint material molded in the mold is cured through light irradiation, the mold is released from the cured imprint material, thereby forming the cured pattern of the imprint material on the substrate.

Positioning between the substrate and the mold at the time of molding the imprint material in the mold may be performed by a die-by-die scheme (die-by-die alignment), for example. The positioning based on the die-by-die scheme is performed on the basis of measured moire fringes generated due to overlapping of a substrate mark formed on the substrate with a mold mark formed on the mold by measuring the moire fringes, as described in Published Japanese Translation No. 2011-509516 of the PCT International Publication for Patent Applications, for example. Accuracy of the measurement of moire fringes is affected by illumination conditions when the substrate mark and the mold mark are illuminated. Therefore, appropriate illumination conditions for detecting light from the substrate mark and the mold mark are determined by repeating adjustment (change) of the illumination conditions and measurement of light from the substrate mark and the mold mark for each shot region.

In order to obtain appropriate illumination conditions, light adjustment for optimizing the illumination conditions is performed immediately before the positioning. Japanese Unexamined Patent Application Publication No. 2017-183364 describes a method of performing light adjustment for all shot regions on a first substrate and using illumination conditions for all the shots obtained in the light adjustment at that time as illumination conditions for other substrates as well in order to shorten a time required for the light adjustment. However, according to the method in Japanese Unexamined Patent Application Publication No. 2017-183364, illumination conditions when the substrate mark and the mold mark are detected are determined for all the shot regions on the first substrate, and it thus takes a significantly long time. As a result, a throughput deteriorates, and producibility is reduced, for example.

On the other hand, Japanese Unexamined Patent Application Publication No. 5-13292 describes acquiring reflectance distribution in shot regions on the entire substrate in advance and adjusting illumination conditions for all the shot regions with reference to the reflectance distribution.

However, it is not possible to obtain the illumination conditions for the shot regions on the entire substrate in a short time.

An object of the present invention is to provide an imprint method capable of improving the aforementioned related arts and shortening a time for acquiring illumination conditions.

SUMMARY OF THE INVENTION

In order to solve the aforementioned problem, the present invention provides an imprint method for forming a pattern on an imprint material supplied onto a substrate using a mold, the method including: performing a first illumination process of illuminating a mold mark formed on the mold and a substrate mark formed in each of a plurality of first shot regions on the substrate and adjusting each of illumination conditions in a state in which the mold and the imprint material supplied to each of the plurality of first shot regions are brought into contact with each other; and performing a deriving process of deriving approximate illumination conditions indicating illumination conditions for a second shot region that is different from the plurality of first shot regions, on the basis of each of the illumination conditions for the plurality of first shot regions adjusted in the first illumination process.

Further features of the present invention will become apparent from the following description of exemplary embodiments with reference to the attached drawings.

DESCRIPTION OF THE EMBODIMENTS

Hereinafter, preferred embodiments of the present invention will be described using examples with reference to the accompanying drawings. Note that the same reference signs are applied to the same members or elements in each drawing, and repeated description will be omitted or simplified.

First Embodiment

Figure 1:
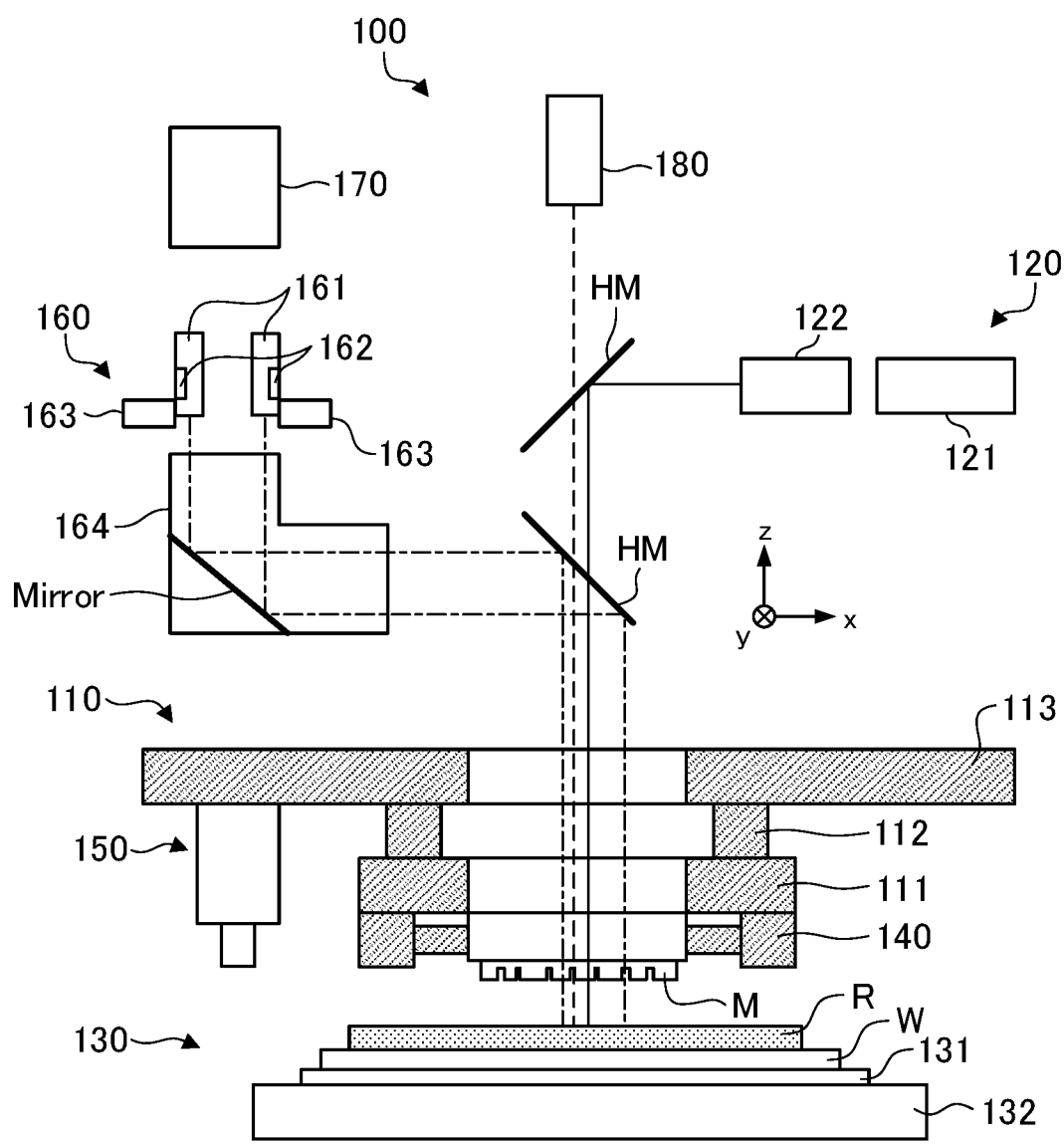
FIG. 1 is an overview diagram illustrating a configuration of an imprint apparatus that uses a method according to a first embodiment.

FIG. 1 is an overview diagram illustrating a configuration of an imprint apparatus 100 that uses a method according to the embodiment. Here, the imprint apparatus 100 using a light-curing method is an ultraviolet-curing imprint apparatus that cures an uncured imprint material R on a substrate through irradiation with light with a predetermined wavelength, for example, with ultraviolet light. However, a method using irradiation with light in another wavelength region or a method using other energy (for example, heat) may be used as a method for curing the imprint material R. Also, in FIG. 1, the Z axis is illustrated in parallel to an optical axis of the ultraviolet light with which the imprint material R on a substrate W is irradiated, and the X axis and the Y axis that perpendicularly intersect each other are illustrated in a plane that is perpendicular to the Z axis.

The imprint apparatus 100 according to the embodiment is configured to form patterns in a plurality of shot regions on the substrate W through repeated imprint processing. Here, the imprint processing indicates a serial cycle including supply of the imprint material R to the substrate W, contact between a mold M and the imprint material R and filling of a pattern in the mold M with the imprint material R, positioning (alignment), curing (exposure), and peeling of the mold M.

The imprint apparatus 100 includes a mold holding unit 110, an irradiation unit 120, a substrate holding unit 130, a mold deformation unit 140, a dispenser 150, an alignment measurement unit 160, a control unit 170, and a scope 180.

The mold holding unit 110 includes a mold-side chuck 111 configured to hold the mold (mask, mold) M, a drive unit 112 that drives the mold-side chuck 111 to move the mold M, and a base 113 configured to support the drive unit 112. The holding of the mold M with the mold-side chuck 1/1 is achieved using a vacuum suctioning force, an electrostatic force, or the like. The drive unit 112 controls the position of the mold M in relation to six predetermined axes, presses the mold M against the substrate W or the imprint material R on the substrate W, and peels (releases) the mold M from the cured imprint material R. Here, the six axes are an X axis, a Y axis, and a Z axis of an XYZ coordinate system and rotation around each of the axes.

The mold M has a rectangular outer peripheral portion, for example, a predetermined uneven pattern is formed in a three-dimensional form on a surface thereof facing the substrate W, and the mold M is configured of a material that transmits ultraviolet light (such as quartz). The substrate W is a substrate onto which the uneven pattern is to be transferred and includes, for example, a single crystal silicon substrate or a silicon-on-insulator (SOI) substrate.

The irradiation unit 120 includes a light source 121 and an optical system 122 and irradiates the imprint material R with ultraviolet light via the mold M to cure the imprint material R. The light source 121 includes, for example, a light source such as a mercury lamp configured to generate ultraviolet light (for example, an i beam or a g beam) and an oval mirror configured to collect light generated by the light source.

The optical system 122 includes a lens, an aperture, a half mirror HM, and the like for irradiating the imprint material R in shot regions (shot positions, pattern formation regions, imprint region) on the substrate W with light for curing the imprint material R. The aperture is used for image angle control and outer peripheral light blocking control. It is possible to illuminate only targeted shot regions through the image angle control, and it is possible to control irradiation with ultraviolet light beyond the shot regions on the substrate W through the outer peripheral light blocking control. The optical system 122 may include an optical integrator for uniformly illuminating the mold M. Light in a range defined by the aperture is incident on the imprint material R on the substrate W via an image forming system (not illustrated) and the mold M.

The substrate holding unit 130 includes a substrate-side chuck 131 configured to hold the substrate W and a stage 132. The substrate-side chuck 131 holds the substrate W using a vacuum suctioning pad, for example. The stage 132 holds the substrate-side chuck 131 and is driven by a drive mechanism, which is not illustrated, to cause the substrate W to move in relation to the six axes, thereby positioning the substrate W and the mold M. The drive mechanism may be configured of a plurality of drive mechanisms such as a rough movement drive mechanism and a fine movement drive mechanism.

The mold deformation unit 140 is mounted on the mold-side chuck 111, for example, and can deform the mold M (pattern region) by pressurizing the mold M from an outer peripheral direction using a cylinder that operates with air or a fluid such as oil. In addition, the mold deformation unit 140 further includes a temperature control unit configured to control the temperature of the mold M and deforms the shape of the mold M by controlling the temperature of the mold M. The substrate W can be deformed (expanded or contracted, for example) through a process such as a heat treatment. The mold deformation unit 140 corrects the shape of the mold M such that the positions and the shape of the predetermined shot regions on the substrate W and the mold M conform to each other, in accordance with such deformation of the substrate W.

The dispenser (supply unit) 150 has, for example, a tank configured to accommodate the imprint material R, a nozzle configured to eject, to the substrate W, the imprint material R supplied from the tank through a supply path, a valve provided in the supply path, and a supply amount control unit. The supply amount control unit controls the valve and thus controls the amount of imprint material supplied to the substrate W such that a predetermined amount of imprint material R is applied to one shot region in one ejection operation of the imprint material R, for example. Here, the dispenser 150 functions as a mechanism configured to supply the imprint material R. The supply mechanism may be provided in an apparatus that is different from the imprint apparatus and may perform imprint processing by transporting the substrate, to which the imprint material R has been supplied, to the imprint apparatus.

The alignment measurement unit 160 includes a scope 161, an adjustment unit 162 provided in the scope 161, a stage 163, and an optical system 164. The scope 161 detects, via a transparent mold M, an alignment mark formed on the mold M (mold mark Mmark) and an alignment mark formed on the substrate W (substrate mark Wmark). In the embodiment, positioning (alignment) is performed based on the die-by-die scheme. Here, the detection of the alignment marks on the mold M and the substrate W is performed by measuring moire fringes that are generated due to overlapping of the alignment marks on the mold M with the substrate W in a state in which the substrate W is brought into contact with the mold M via the imprint material R supplied onto the substrate mark Wmark.

Note that, as the detection of the alignment marks on the mold M and the substrate W, each of images of the mold mark Mmark formed on the mold M and the substrate mark Wmark formed on the substrate may be detected. The adjustment unit 162 includes a wavelength filter, a neutral-density filter, a filter for changing the shape of an illumination region, a light flux shaping unit, an illumination light source for alignment, and the like and can adjust (change) illumination conditions (the light amount, the wavelength, and the shape of illumination light) of the alignment marks on the mold M and the substrate W using these. Note that the illumination light source for alignment is a light source for irradiating the alignment marks on the mold M and the substrate W with light with a wavelength at which the imprint material is not cured.

The adjustment unit also functions as an illumination mechanism (adjustment mechanism) configured to adjust the illumination conditions. The stage 163 positions the scope 161. The optical system 164 includes a lens, an aperture, a mirror, a half mirror HM, and the like for adjusting a light path of the scope 161.

The control unit 170 controls operations of components in the imprint apparatus 100, such as the drive unit 112 and the stage 180, for example, adjustment processing, and the like. In addition, the control unit 170 also functions as a deriving mechanism configured to derive approximate illumination conditions, which will be described later. The control unit 170 is configured of a computer that has a storage mechanism such as a magnetic storage medium, a memory recording a computer program, a sequencer (not illustrated), and the like connected using a line (in a wired or wireless manner) to components in the imprint apparatus 100.

Further, a CPU configured to execute the computer program is incorporated. The method according to the embodiment can be performed by the computer executing the program. Also, the control unit 170 may be provided inside the imprint apparatus 100 or may be placed at a location that is different from the imprint apparatus 100 and may perform remote control. Note that the control unit 170 also functions as a control mechanism.

The scope 180 (observation unit) is a scope configured to observe all of the shot regions and check an imprint state, stamping, and a progress of filling with the imprint material R. In addition, the imprint apparatus 100 also has a bridge surface plate for holding the mold holding unit 110, a base surface plate for holding the substrate holding unit 130, and the like, although illustration is omitted.

Figure 2A:
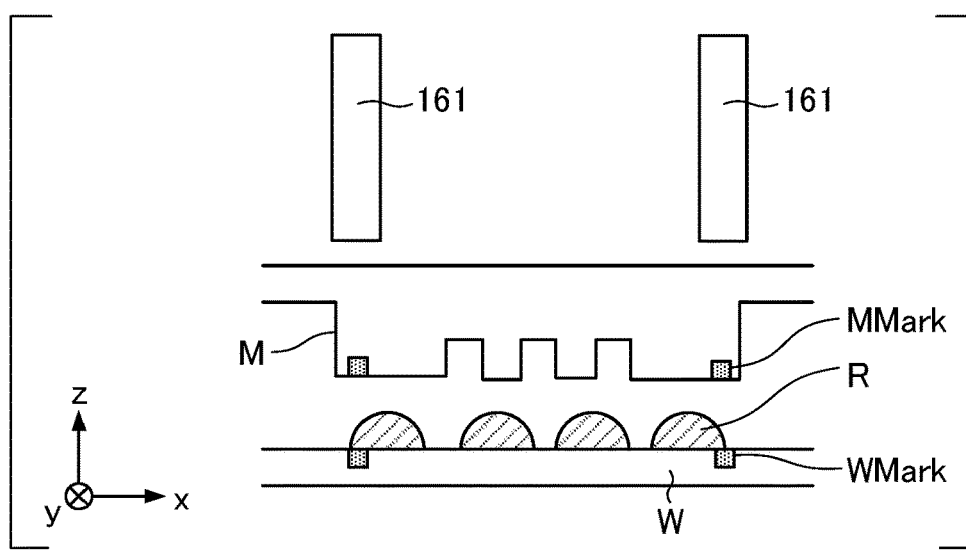
FIG. 2A is a diagram illustrating a process before a mold M and an imprint material R supplied onto a substrate W are brought into contact with each other.
Figure 2B:
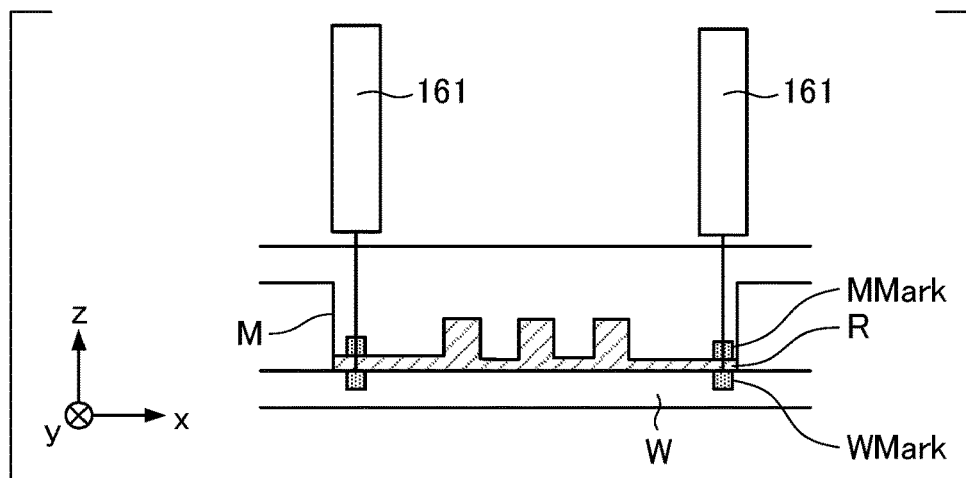
FIG. 2B is a diagram illustrating a state in which the mold M and the imprint material R supplied onto the substrate W have been brought into contact with each other.
Figure 2C:
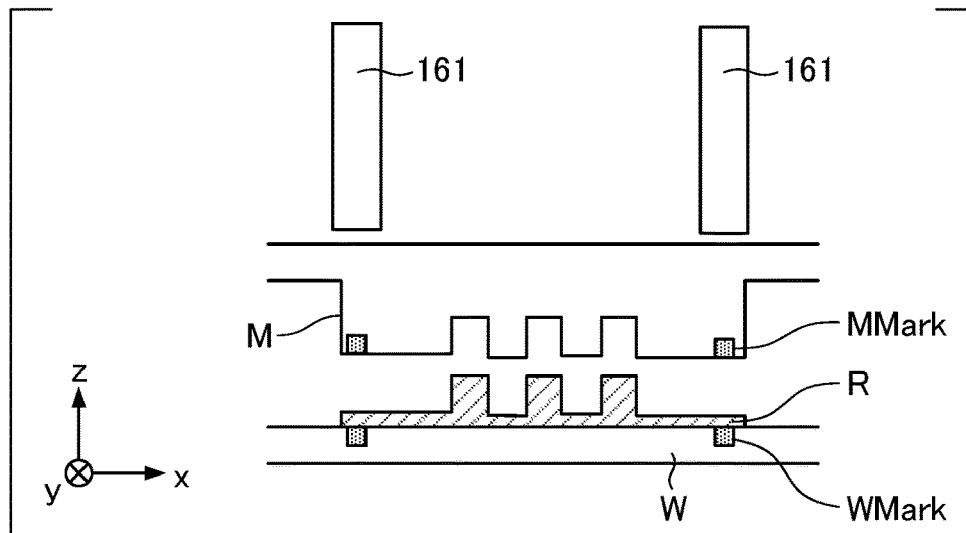
FIG. 2C is a diagram illustrating a state in which the mold M has been released from the imprint material R supplied onto the substrate W.

FIG. 2 is a sectional view of the mold M and the substrate W for explaining the imprint method according to the embodiment. FIG. 2A illustrates a process before the mold M and the imprint material R supplied onto the substrate W are brought into contact with each other. FIG. 2B illustrates a state in which the uneven pattern on the surface of the mold M is filled with the imprint material R supplied onto the substrate W by bringing the mold M and the imprint material R supplied onto the substrate W into contact with each other. Also, a process of performing die-by-die alignment, that is, alignment for each shot, in this state is illustrated. At this time, a state in which moire fringes can be observed by the scope 161 has been achieved. After the alignment is completed in the state of FIG. 2B, the imprint material R is irradiated with ultraviolet light via the mold M to cure the imprint material R. Thereafter, a releasing operation for releasing the mold M from the imprint material R supplied onto the substrate W is performed as illustrated in FIG. 2C.

In the imprint method according to the embodiment including a series of operations as illustrated in FIGS. 2A to 2C, illumination conditions for the alignment marks on the mold M and the substrate W that are optimal for the die-by-die alignment are first acquired using a substrate for adjustment (first substrate). Then, illumination conditions are acquired for each of a plurality of shot regions on the first substrate. At the time of the acquisition, the illumination conditions are adjusted while the alignment marks on the mold M and the substrate W are positioned, and thereby optimal illumination conditions for each shot region are acquired, in the state in FIG. 2B. The shot regions for which optimal illumination conditions have been acquired in this manner will be referred to as measurement shot regions (first shot regions). Then, after the optimal illumination conditions are acquired for each of the measurement shot regions, the imprint material in the measurement shot regions is irradiated with ultraviolet light and cured in the state in FIG. 2B. Then, releasing processing in FIG. 2C is performed.

In the embodiment, shot regions for which the illumination conditions are not obtained as described above will be referred to as approximate shot regions (second shot regions). Also, all shot regions other than the measurement shot regions correspond to the approximate shot regions in the embodiment. As illumination conditions for the approximate shot regions, optimal conditions of the illumination conditions acquired for the aforementioned plurality of measurement shot regions are derived and acquired as approximate illumination conditions by performing an approximate function operation, for example, using a function in the embodiment. When the imprint processing in FIGS. 2A to 2C is performed, in particular, when the alignment in FIG. 2B is performed on the approximate shot regions, illumination is performed, and alignment adjustment is performed on the basis of the aforementioned derived approximate illumination conditions. After the imprint material is irradiated and cured with ultraviolet light after the alignment adjustment, releasing is performed as illustrated in FIG. 2C.

In this manner, the illumination conditions are acquired for all the shot regions on the first substrate through measurement or approximation, and the imprint processing is performed.

When the imprint processing of the substrate for adjustment (first substrate) ends, then imprint processing including a process of performing die-by-die alignment on a substrate for a product (second substrate) on the basis of the acquired optimal conditions is performed.

The illumination conditions for the alignment marks on the mold M and the substrate W depend mainly on reflection properties and the shape of the substrate mark Wmark that is an alignment mark provided on the substrate W. Thus, the substrate for adjustment and the substrate for a product are prepared to have the same alignment marks. Also, the other conditions such as irregularity of application of flat films applied to the substrate W are set to be the same. The substrate for adjustment may be prepared separately from the substrate for a product, or two substrates may be selected from the same lot. In other words, the substrate W at the head may be used as the substrate for adjustment, and the second substrate W may be used as the substrate for a product in the same lot. Note that it is needless to say that the substrate for adjustment may be used as a product.

Figure 3:
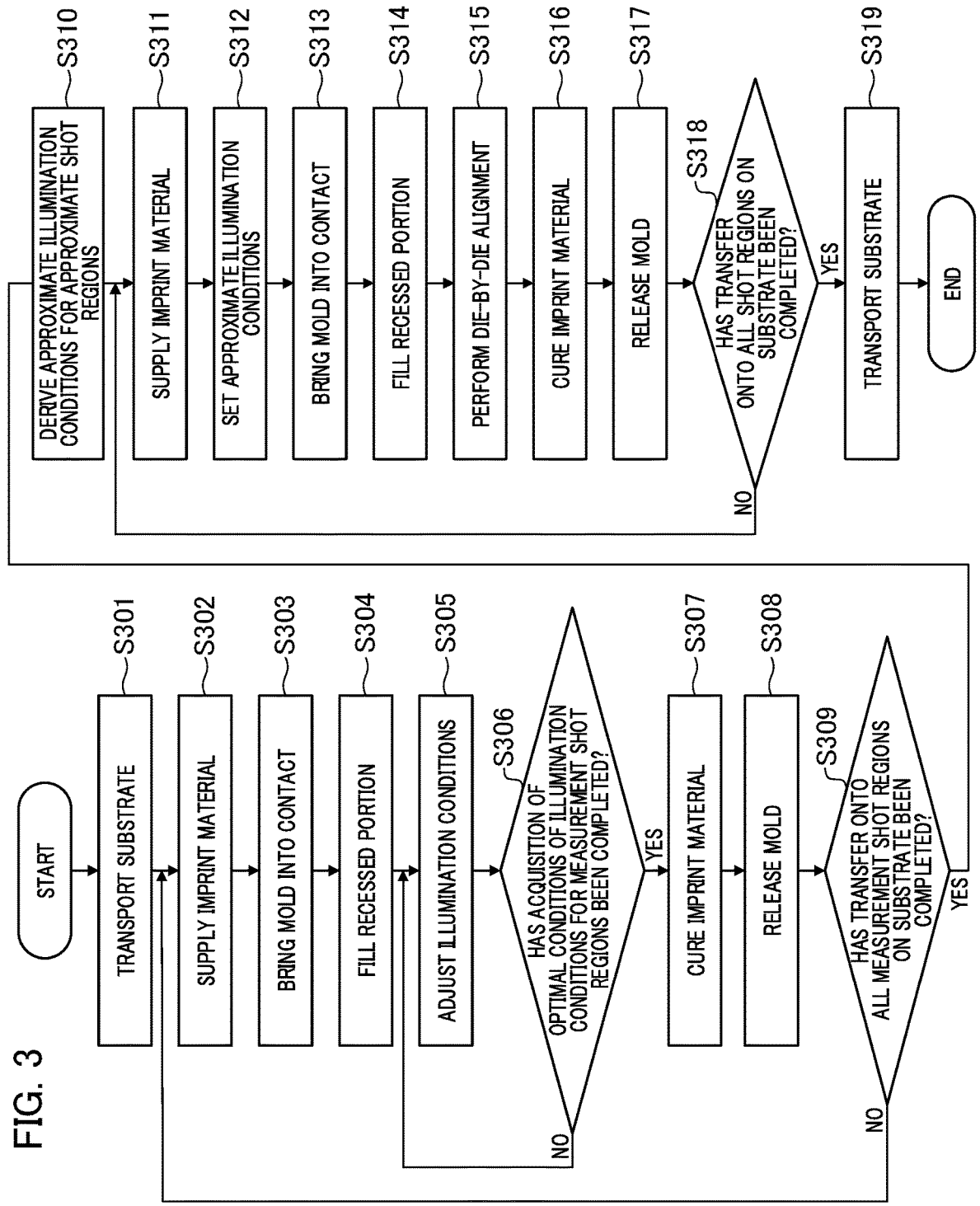
FIG. 3 is a flowchart illustrating an imprint method for a substrate for adjustment including the method according to the first embodiment.

FIG. 3 is a flowchart of the imprint method including the method according to the embodiment. The embodiment will be described on the basis of FIG. 3.

First, in Process S301, the control unit 170 controls a transport apparatus (not illustrated) to transport the substrate for adjustment to the substrate holding unit 130, for example. Next, in Process S302, the control unit 170 controls the dispenser 150 to supply the imprint material R to a predetermined measurement shot region on the transported substrate W. At this time, the imprint material R is also supplied onto the substrate mark Wmark. The control unit 170 controls the mold holding unit 110 or the substrate holding unit 130 to cause the predetermined measurement shot region on the substrate W, onto which the imprint material R has been supplied, to move to a place immediately below the mold M.

The positional relationship between the mold mark Mmark that is a mold-side mark formed on the mold M and the substrate mark Wmark that is a substrate-side mark formed on the substrate W after the movement is as illustrated in FIG. 2A. Next, in Process S303, the control unit 170 controls the drive unit 112 to bring the imprint material R and the mold M into contact with each other. Note that the mold M may be slightly deformed into a projecting shape with respect to the substrate and may be brought into contact with the imprint material at this time. Next, in Process S304, the control unit 170 controls the drive unit 112 and the like to keep the contact between the mold M and the imprint material R and fills recessed portions of the uneven pattern on the mold M with the imprint material R such that moire fringes can be observed using the scope 161. In this manner, the state in FIG. 2B is achieved.

Next, in Process S305, illumination conditions for the alignment marks on the mold M and the substrate W are optimized, and the illumination conditions are then adjusted to acquire optimal conditions (first illumination process). The control unit 170 compares the shape of the moire fringes that are enabled to be observed in Process S304 with a shape of predetermined moire fringes and controls the adjustment unit 162 on the basis of a result of the comparison. Then, the mold mark Mmark and the substrate mark Wmark are illuminated with the illumination light source for alignment, and the illumination conditions (the light amount, the wavelength, a template for pattern matching, and the like) are adjusted. Note that an image sensor, for example, may be used for the adjustment of the illumination conditions to adjust the pattern on the mold M and the pattern of the alignment mark on the substrate W using an imaging period (accumulation time).

Also, positioning (first positioning process) between the mold mark Mmark and the substrate mark Wmark is performed while the illumination conditions are adjusted in the first illumination process, for each of the first shot regions. Since contrast of the moire fringes is affected by the light amount and the wavelength, the illumination conditions are adjusted to obtain a higher contrast. The control unit 170 compares the shape of the moire fringes observed under the adjusted illumination conditions with the shape of the predetermined moire fringes and performs alignment adjustment.

Next, in Process S306, it is determined that the optimal conditions have been acquired if the illumination conditions adjusted in Process S305 fall within a predetermined threshold range, and the processing proceeds to Process S307. If the illumination conditions do not fall within the predetermined threshold range, the processing returns to Process S305, the illumination conditions are adjusted, and the comparison of moire fringes is repeated until the comparison result falls within the predetermined threshold range. The illumination conditions obtained when the comparison result falls within the predetermined threshold range are stored (recorded) as optimal conditions in a storage unit (not illustrated) of the control unit 170, for example.

Also, the control unit 170 may be caused to store the optimal conditions, or an external storage unit (not illustrated) connected to the control unit 170 in a wired or wireless manner may be caused to store the optimal conditions. Since the optimal conditions are different from each other for each shot region, the optimal conditions are obtained for each shot region. In this manner, the alignment adjustment and the adjustment of the optimal illumination conditions are performed in parallel. Note that illumination conditions at the timing at which the alignment adjustment is completed may be stored as optimal illumination conditions.

However, the measurement shot regions for which the optimal conditions are obtained are not all the shot regions on the substrate W in the embodiment. In other words, the embodiment is characterized in that the measurement shot regions are limited to a necessary number of regions for deriving the approximate illumination conditions in Process S310, which will be described later, at predetermined separate positions on the substrate. For example, only shots at the center of the substrate W and in the periphery (at four corners, for example) of the substrate W may be selected as the measurement shot regions. In regard to the selection of the measurement shot regions, the measurement shot regions may be selected in advance or dynamically changed in accordance with optimal illumination conditions acquired in the measurement shot regions. For example, after optimal illumination conditions are acquired for each of two adjacent measurement shot regions selected in advance, a difference in the illumination conditions thereof is examined. Control may be dynamically performed such that in a case in which the difference is greater than a predetermined threshold value, a shot region at an intermediate position between the measurement shot regions is newly added as a measurement shot region and optimal illumination conditions for the added measurement shot region are additionally acquired.

Next, in Process S307, the control unit 170 controls the irradiation unit 120 to irradiate the imprint material R with ultraviolet light to cure the imprint material R. Then, in Process S308, the mold holding unit 110 or the substrate holding unit 130 is controlled to peel the mold M from the cured imprint material R. Next, in Process S309, the control unit 170 determines whether or not the imprint processing has been completed on all the measurement shot regions on the substrate W. In a case in which the imprint processing has not been completed (No), the imprint processing in Processes S302 to S308 is repeated. If the imprint processing has been completed (Yes), the processing proceeds to Process S310.

In Process S310, first, the control unit 170 reads the optimal illumination conditions for each of the measurement shot regions, which have been adjusted in the first illumination process for the plurality of measurement shot regions and have been stored in the storage unit (not illustrated) of the control unit 170, and which have been acquired for the plurality of measurement shot regions. Then, approximate illumination conditions for approximate shot regions that are different from the plurality of measurement shot regions are derived through function approximation (for example, an interpolation operation) for each of the approximate shot regions (deriving process). For the function approximation, high-order or low-order approximation may be used. Also, the approximate illumination conditions for each approximate shot region are stored in the storage unit (not illustrated) of the control unit 170, for example, similarly to the storage of the optimal conditions in Process S306. Alternatively, the control unit 170 may be caused to store the approximate illumination conditions, or an external storage unit (not illustrated) connected to the control unit 170 in a wired or wireless manner may be caused to store the approximate illumination conditions.

In this manner, as long as each shot region on the substrate is a measurement shot region, optimal illumination conditions for each shot region are stored for each measurement shot region. Also, if the shot region is an approximate shot region, then the approximate illumination conditions are stored for each shot region. In other words, the optimal illumination conditions or approximate illumination conditions for each shot region are stored for each of the shot regions on the substrate. Note that the measurement shot regions that are the first shot regions and the approximate shot regions that are the second shot regions in the embodiment are assumed to be shot regions on the same substrate.

Next, since processing similar to that in Process 302 is performed in Process S311, description thereof will be omitted. Next, in Process S312, the control unit 170 reads (acquires) the approximate illumination conditions obtained in Process S310 from the storage unit (not illustrated) and controls the adjustment unit 162 to set the approximate illumination conditions used when the alignment marks on the mold M and the substrate W are illuminated. The setting may be performed before Process S315 in which the die-by-die alignment that will be described later is performed and may be performed in parallel with the processing in Processes S311 to S313. Since processing similar to that in Process S303 and Process S304 is performed in Process S313 and Process S314, respectively, description thereof will be omitted.

Next, in Process S315, the control unit 170 obtains relative positions of the mold mark Mmark and the substrate mark Wmark on the basis of a detection result of moire fringes obtained by the scope 161. At this time, the mold mark Mmark and the substrate mark Wmark are illuminated on the basis of the approximate illumination conditions derived in the deriving process (second illumination process). Then, the stage 132 and the mold deformation unit 140 are controlled to perform die-by-die alignment, thereby performing positioning (second positioning process). At this time, since the approximate illumination conditions for the approximate shot regions have been derived in advance in Process S310, and the setting of the approximate illumination conditions has been completed in Process S312, it is not necessary to take time to perform feedback adjustment or the like for the illumination conditions of the alignment marks on the mold M and the substrate W from an initial state in Process S315.

This leads to an improvement in throughput, making it possible to improve producibility. Note that, in a case in which the approximate illumination conditions are set to perform illumination, the illumination conditions may be finely adjusted through feedback from the approximate illumination conditions as needed. It is possible to complete the adjustment of the illumination conditions in a significantly shorter time in that case as well as compared with a case in which the illumination conditions are adjusted by taking time from the initial state.

Next, the processing proceeds to Process S316. Since processing similar to that in Process S307 and Process S306 is performed in Process S316 and Process S317, respectively, description thereof will be omitted. In Process S318, the control unit 170 determines whether or not the imprint processing has been completed for all the approximate shot regions on the substrate W. In a case in which the imprint processing has not been completed (No), the imprint processing in Processes S311 to S317 is repeated. If the imprint processing has been completed (Yes), the processing proceeds to Process S319, and the control unit 170 controls the transport apparatus (not illustrated) to transport the substrate W.

Figure 4:
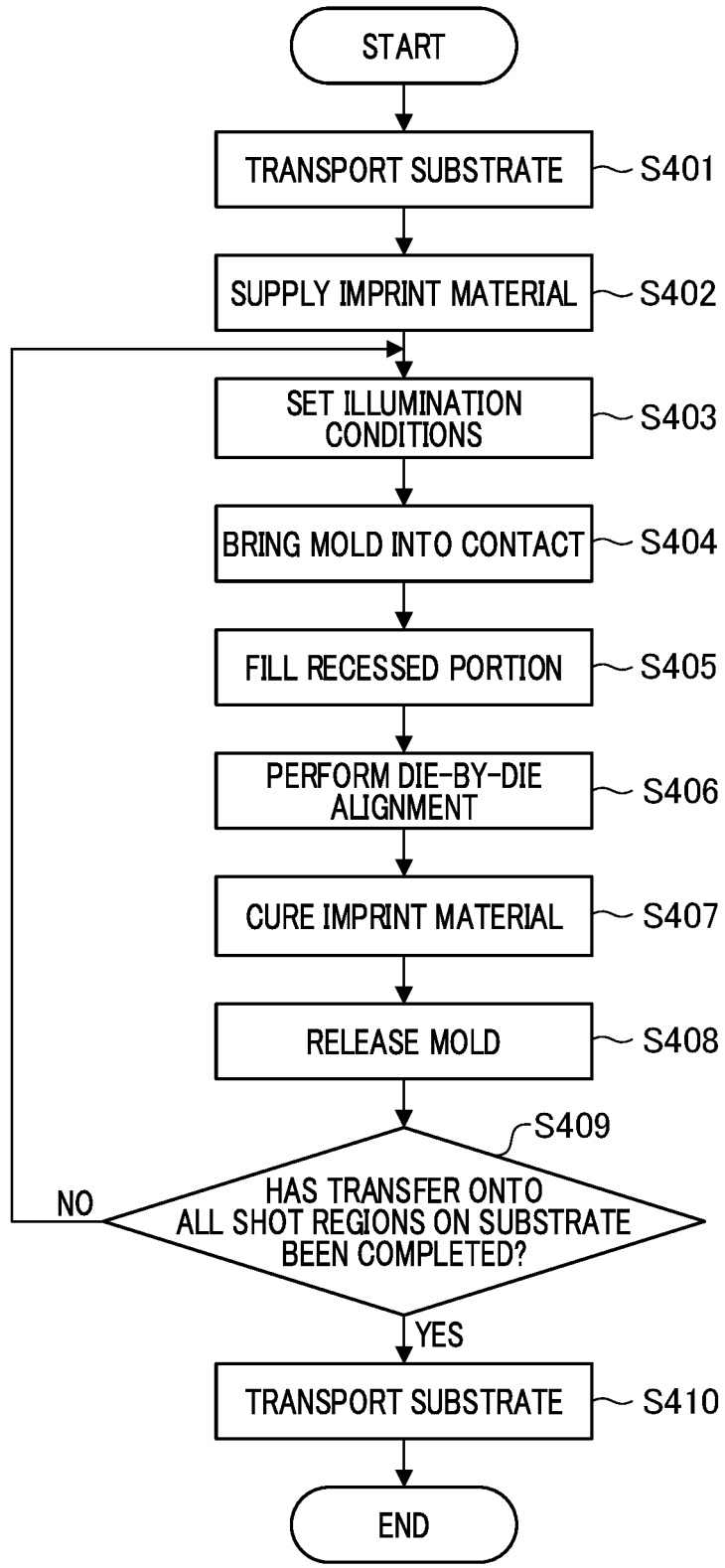
FIG. 4 is a flowchart illustrating an imprint method for a substrate for a product including the method according to the first embodiment.

FIG. 4 is a flowchart illustrating a sequence for efficiently manufacturing a substrate W for a product in the same lot as a substrate for adjustment, using illumination conditions acquired using the substrate for adjustment, for example. The substrate for a product and the substrate for adjustment have the same number of shot regions, and the same patterns as those in each of the shot regions on the substrate for adjustment are formed in each of the shot regions on the substrate for a product.

Note that the substrate for adjustment is said to be "for adjustment" for convenience in the embodiment, and the substrate for adjustment may be shipped as a substrate for a product as described above since the substrate for adjustment is of sufficient quality.

First, in Process S401, the substrate W is transported. Since processing similar to that in Process S311 is performed in Process S402, description thereof will be omitted. Next, in Process S403, the control unit 170 reads optimal illumination conditions or approximate illumination conditions for each of the shot regions on the substrate stored in the storage unit (not illustrated) of the control unit 170 and controls the adjustment unit 162 and the like to set the illumination conditions for illuminating the alignment marks on the mold M and the substrate W. As the illumination conditions used here, the optimal conditions are used for shot regions for which the optimal conditions have been acquired in Process S306, and the approximate illumination conditions are used for shot regions for which the approximate illumination conditions have been acquired in Process S310. Since processing similar to that in Processes S313 to S319 is performed in Processes S404 to S410, respectively, description thereof will be omitted.

Note that, in Process S406, the illumination conditions may be more finely adjusted for each of the shot regions with reference to the optimal illumination conditions or the approximate illumination conditions for each of the shot regions on the substrate. In a case in which the fine adjustment is performed, the result may be saved as illumination conditions for the next substrate. Also, the optimal conditions of the illumination conditions acquired for the measurement shot regions and the approximate illumination conditions acquired for the approximate shot regions may be used for each of shot regions on another substrate W in the same lot. Also, in a case in which the fine adjustment is further performed as described above, the result may be applied as a reference for each of the shot regions on the next substrate. In the embodiment, since the mold mark Mmark and the substrate mark Wmark in each of the shot regions corresponding to the substrate for a product (the second substrate and the following substrates in the same lot) on which imprint processing is performed are illuminated using the optimal illumination conditions or the approximate illumination conditions for the first substrate as a reference as described above, it is possible to shorten the time for adjusting the illumination as a whole.

Second Embodiment

Figure 5A:
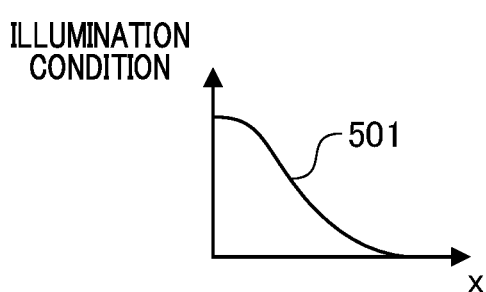
FIG. 5A is a graph representing one element included in illumination conditions on the vertical axis.
Figure 5B:
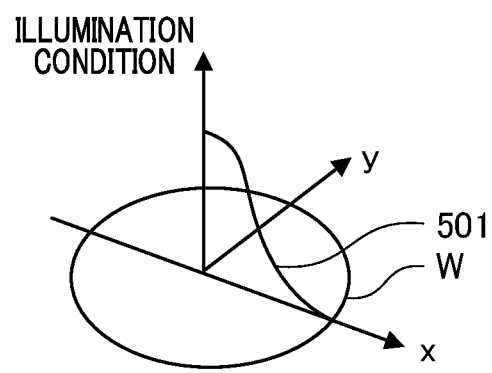
FIG. 5B is a diagram in which an approximate function of FIG. 5A is arranged in a two-dimensional space of an X-Y plane.

FIG. 5 is a diagram illustrating an approximate function for obtaining approximate illumination conditions according to this embodiment. In the embodiment, the approximate illumination conditions are derived and acquired through a function operation using a function. Also, a high-order or low-order function may be used to derive the approximate illumination conditions when the function operation is performed. FIG. 5A is a graph in which one of elements included in illumination conditions is represented by a vertical axis, and a first-order approximate function is represented in the direction of the X axis. FIG. 5B is a diagram in which the first-order approximate function is arranged in a two-dimensional space of an X-Y plane. FIG. 5 illustrates an example, and the values of the graph and an approximate function 501 are not limited thereto. As described above, the illumination conditions include a plurality of elements, and the vertical axis of the graph illustrated in FIGS. 5A and 5B represents one of elements of the illumination conditions. In S310 that is a process of deriving the approximate illumination conditions illustrated in FIG. 3, the control unit 170 may directly calculate the approximate function 501 in the two-dimensional space in the X-Y plane, for example, Equation (1) below.

$$f(x,y)=ax^2+by^2+cxy+dx+ey+f \tag{1}$$

In Equation (1) above, $x^2$ represents a square of x, and $y^2$ represents a square of y.

Alternatively, as the approximate function 501 in a one-dimensional space in a radius from the center of the substrate W toward an end of the substrate W, Equation (2) below, for example, may be calculated, and the approximate function 501 in the one-dimensional space may be rotated about an axis that is perpendicular to the X-Y plane from the center of the substrate W.

$$g(r)=gr^2+hr+i \tag{2}$$

In Equation (2) above, $r^2$ represents a square of r. r represents a distance from the center of the substrate W, and each of x and y represents coordinates on the substrate W. Also, the distance r from the center of the substrate W can be represented by Equation (3) below.

$$r=\sqrt{x^2+y^2} \tag{3}$$

As described above, the approximate illumination conditions may be acquired by expanding the approximate function 501 in the one-dimensional space to f(x,y) that is an approximate function in a two-dimensional space. In this case, the number of measurement shot regions required to create the approximate function is three or more for the approximate function 501 in the two-dimensional space and two or more for the approximate function 501 in the one-dimensional space. Also, although the approximate illumination conditions may be acquired through one rotation about the center of one substrate W as an axis, the present invention is not limited thereto. For example, half-rotation may be performed, or user may be allowed to arbitrarily set the rotation.

In the case in which the approximate function 501 in the one-dimensional space is expanded to the approximate function in the two-dimensional space through rotation, it is only necessary to select a plurality of shot regions for acquiring optimal conditions in a radius section from the center to a periphery of the substrate W in order to create the approximate function 501 in the one-dimensional space. Thus, there is an effect of improving a throughput. Also, a plurality of approximate functions 501 in the radial direction from the center of the substrate W toward the end of the substrate W in the one-dimensional space may be calculated and averaged to acquire a first-order function before the expansion through the rotation.

Also, the numbers of orders of the approximate function 501 in the two-dimensional space and the approximate function 501 in the one-dimensional space may be either high orders or low orders. For example, an example of a high-order function is represented as Equation (4) below.

$$L(x,y)=ax^2+by^2+cxy+dx+ey+f \tag{4}$$

For example, an example of a low-order function is represented as Equation (5), below.

$$L(x,y)=ax+by+cxy+d \tag{5}$$

Here, L(x,y) is approximate illumination conditions for the shot located at the coordinates (x,y) on the substrate W.

Note that the reflectance on the surface of the substrate W tends to change from the center toward the outer periphery of the substrate W. Therefore, the high-order function or the low-order function may be selectively used in accordance with a case, and for example, the high-order function may be used for higher accuracy, and the low-order function may be used to reduce coefficients and thus the amount of arithmetic operations.

Note that that a function table may be used when the approximate illumination conditions are acquired, and the case in which the approximate illumination conditions are acquired using the function table represented as Equation (6) below.

$$L(s) = \begin{cases} a, (s=1) \\ b, (s=2) \\ \vdots \end{cases} \tag{6}$$

Here, L(s) is illumination conditions for a shot region with a number s. The function table is obtained from data obtained by statistically processing optimal conditions (or approximate illumination conditions) of illumination conditions obtained from a substrate on which imprint processing has already been performed and optimal conditions of illumination conditions obtained from a substrate on which imprint processing has been performed in the past. Also, an arbitrary period, for example, may be set when the function table is set, and data obtained by statistically processing the optimal conditions or the approximate illumination conditions acquired in the period may be used. This enables acquisition of approximate illumination conditions in accordance with situations.

Since the approximate illumination conditions for the approximate shot regions can be calculated through the function approximation before the mold and the imprint material are brought into contact with each other, the control unit 170 may group the plurality of shot regions with equal or similar approximate illumination conditions and determine an order of stamping (pattern formation) of the shot regions for each of the groups.

Figure 6:
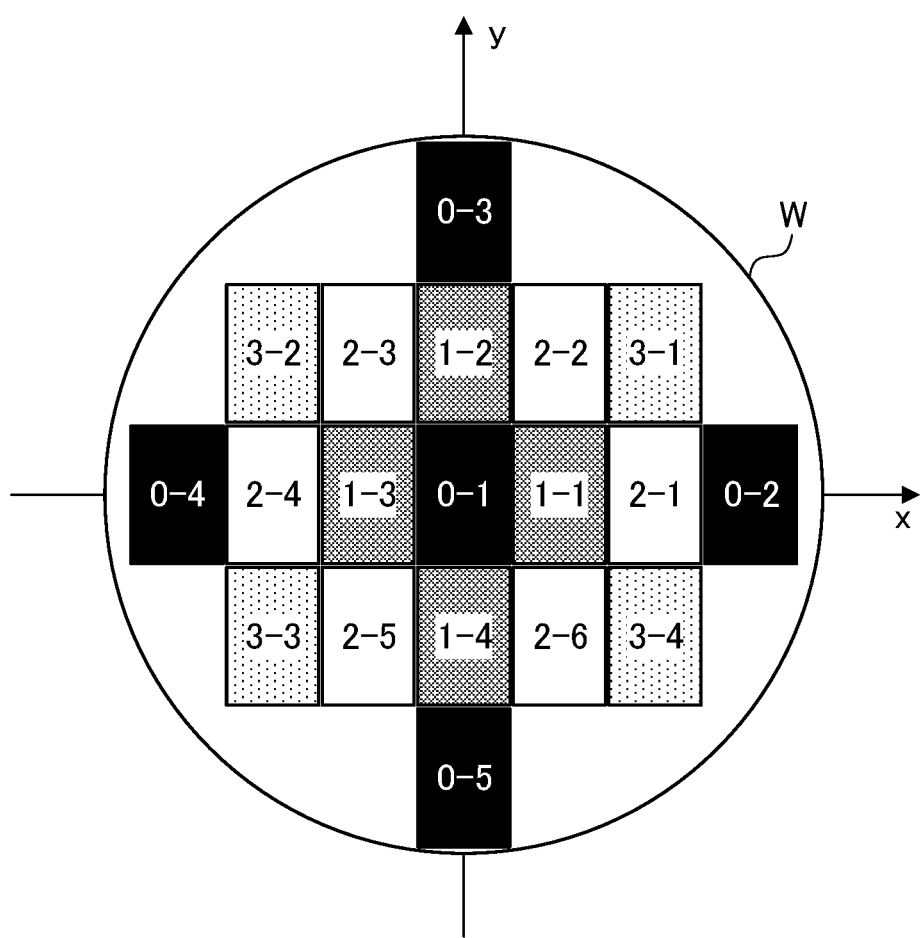
FIG. 6 is a diagram illustrating shot arrangement on a substrate for explaining a method according to a third embodiment.

For example, 0-1 to 0-5 are assumed to be measurement shot regions, and 1-1 to 3-4 are assumed to be approximate shot regions in FIG. 6. Also, a first group from 1-1 to 1-4, a second group from 2-1 to 2-6, and a third group from 3-1 to 3-4 are assumed to be groups with equal or similar approximate illumination conditions, from among the measurement shot regions. Also, the approximate illumination conditions of each group are assumed to gradually change in one direction in this order. At this time, an order of stamping is assumed to be an order of the group from 1-1 to 1-4, the group from 2-1 to 2-6, and the group from 3-1 to 3-4.

Note that the order of groups for shot stamping may be a reverse order. A throughput is improved by performing shot stamping in such order of groups that the approximate illumination conditions gradually change in one direction in this manner. Also, it is desirable that stamping in each group and movement from the last shot region in a certain group to the first shot region in the next group be arranged to minimize the moving distances. In this manner, it is possible to obtain such an order of shots that minimizes the amount of change in drive of the irradiation unit 120 and the moving distance between the shot regions and thereby to improve a throughput. Also, it is possible to determine the order of shots on the basis of the optimal conditions, the approximate illumination conditions, and the moving distances even in a case in which the optimal conditions and the approximate illumination conditions are commonly used for the other substrates in the same lot.

Since reflectance distribution on the substrate W tends to become a concentric as described above, an order of illumination or order of stamping for the measurement shot regions may be set in the outer peripheral direction from the center of the substrate W when the optimal conditions of the illumination conditions are obtained. On the contrary, the order of illumination or the order of stamping for the measurement shot regions may be determined from the outer peripheral direction to the center direction. In this manner, it is possible to minimize a change in amount of drive of the irradiation unit 120 with a change in reflectance.

Note that when the optimal conditions of the illumination conditions are obtained in the first illumination process, a light adjustment time of several tens of seconds to several minutes is generated, for example. At this time, priming processing that is processing of causing the imprint material R to adapt to the mold M after washing may be performed in parallel. In this manner, it is possible to shorten the processing time of the entire imprint processing and to improve a throughput.

Note that in a case in which stamping processing is performed on each substrate in a new lot (different lot), optimal conditions and approximate illumination conditions may be set using, as a reference, the optimal conditions of the illumination conditions and the approximate illumination conditions acquired for the previous lot (another lot) (or statistically processed optimal conditions of illumination conditions and approximate illumination conditions).

Also, the optimal conditions and the approximate illumination conditions may be used as initial conditions (reference) for light adjustment. For example, the control unit 170 may hold a history of illumination conditions required to obtain initial conditions in a storage unit (not illustrated) and perform fine adjustment using the history as initial conditions at the time of light adjustment to calculate the illumination conditions. In this manner, it is possible to shorten the time required to obtain the optimal conditions of the illumination conditions. Also, approximate illumination conditions of other lots may be calculated on the basis of the optimal conditions of the illumination conditions and the approximate illumination conditions for a plurality of lots.

Third Embodiment

A third embodiment will be described using FIG. 6 described above. FIG. 6 is a diagram in which numbers are applied to shot regions on the substrate W. The embodiment is characterized in that the plurality of shot regions on the substrate W are grouped and the imprint material R is continuously supplied to the plurality of shot regions in the group. Also, a so-called batch method in which the mold marks Mmark and the substrate marks Wmark in the shot regions in each group are illuminated under the same illumination conditions and stamping is continuously performed on the shot regions in each group may be used. In the case in which the batch method is used, the plurality of shot regions may be grouped in advance in accordance with the optimal conditions of the illumination conditions and the approximate illumination conditions as described above. Then, after the imprint material R is continuously supplied to the plurality of shot regions in each group obtained through the grouping, operations of illuminating the mold marks Mmark and the substrate marks Wmark in the shot regions in the same group under the same illumination conditions, positioning the mold marks Mmark and the substrate marks Wmark, and performing stamping are repeated thereon.

In other words, S403 to S408 in FIG. 4 are repeated on each of the shot regions in the same group. Note that as the grouping, an example in which the shot regions 1-1 to 1-4 in FIG. 6 are grouped into one group as described above is exemplified. Note that in the case in which the plurality of shot regions are grouped in accordance with the optimal conditions of the illumination conditions and the approximate illumination conditions, the supply of the imprint material R, the stamping on the shot regions in each group, and the illumination of the mold marks Mmark and the substrate marks Wmark may be continuously performed. Alternatively, only the imprint material R may be supplied in a continuous manner, and illumination and the stamping may be performed for each shot, for example, as described above. Note that "in accordance with the optimal conditions of the illumination conditions and the approximate illumination conditions" means that the optimal conditions of the illumination conditions and the approximate illumination conditions are the same or similar conditions.

Also, the following operations may be performed, for example. In other words, the shot regions 1-1 to 1-4 in FIG. 6 are defined to belong to one group in accordance with the optimal conditions of the illumination conditions and the approximate illumination conditions, in terms of the grouping. Then, grouping of the shot regions on the substrate W are further performed, and for example, the shot regions 2-1 to 2-4 are defined to belong to one group. After the shot regions are grouped, the imprint material R may be supplied to the entire surface of the substrate W, and an order of groups in which the illumination and the stamping are performed may then be determined. As the substrate W for which the batch method is used, it is preferable e to perform the method on the substrate for a product for which the optimal conditions of the illumination conditions and the approximate illumination conditions have already been acquired. However, the method may be used for the substrate for adjustment. In that case, the optimal conditions of the illumination conditions are acquired for the measurement shot regions, the approximate illumination conditions are then acquired, and the grouping is then performed.

Also, the batch method may not be used for the process of obtaining the optimal conditions of the illumination conditions, and the batch method may be used for the shot regions with the approximate illumination conditions. In other words, in a case in which the shot regions 0-1 to 0-5 are defined as measurement shot regions in FIG. 6, for example, the batch method is not used for these measurement shot regions, and the supply of the imprint material R and the illumination and the stamping are repeatedly performed for each shot. On the contrary, the batch method may be used for the measurement shot regions, and the batch method may not be used for the approximate shot regions.

Also, it takes time to drive the irradiation unit 120. Therefore, the imprint material R may be successively supplied, the mold mark Mmark and the substrate mark Wmark may be successively illuminated, and the stamping may be successively performed, on the plurality of shot regions on the substrate W, in order in one direction or order with a spiral shape from the center of the substrate W toward the outer peripheral side or from the outer peripheral side toward the center.

Also, application may be made to other substrates in the same lots, for example, a substrate for a product on which the imprint processing is performed next.

In addition, after the grouping is performed, the order of shot stamping in each group may be set from the center of the substrate W to the outer peripheral direction or the reverse order. Also, an order in each group may be determined using a batch method in accordance with the optimal conditions of the illumination conditions and the approximate illumination conditions in each group after the grouping. These enables the drive of the irradiation unit 120 and moving efficiency between shots to be minimized and enables an improvement in throughput.

[Embodiments Related to Article Manufacturing Method]

An article manufacturing method according to this embodiment is suitable for manufacturing an article such as a microdevice such as a semiconductor device and an element with a fine structure. The article manufacturing method according to the embodiment includes a process of forming a pattern on an imprint material applied to a substrate using the aforementioned imprint apparatus 100 (a process of performing imprint processing on the substrate) and a process of treating the substrate with the pattern formed thereon through such a process. Further, such a manufacturing method includes other known processes (oxidization, film formation, deposition, doping, flattening, etching, composition peeling, dicing, bonding, packaging, and the like). The article manufacturing method according to the embodiment is more advantageous in at least one of performance, quality, producibility, and production costs of the article as compared with a method in the related art.

The pattern on the cured article molded using the imprint apparatus 100 is permanently used at least as a part of various articles or is temporarily used when various articles are manufactured. The articles include electric circuit elements, optical elements, MEMSs, recording elements, sensors, molds, and the like. Examples of the electric circuit elements include volatile or nonvolatile semiconductor memory such as DRAMs, SRAMs, flash memories, and MRAMs and semiconductor elements such as LSIs, CCDs, image sensors, and FPGAs. Examples of the molds include molds for imprint.

The pattern on the cured article is used directly as a component that is at least a part of the aforementioned article or is temporarily used as a composition mask. After etching, ion injection, or the like is performed in a substrate treating process, the composition mask is removed. Further, known processes for processing the substrate include etching, resist peeling, dicing, bonding, packaging, and the like.

Figure 7A:
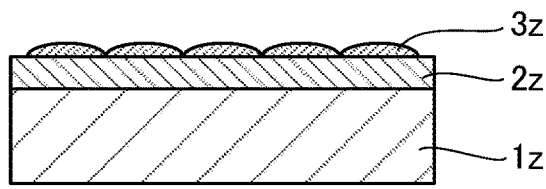
FIG. 7A is a diagram illustrating a situation in which an imprint material has been applied onto a substrate.

Next, a specific article manufacturing method will be described. As illustrated in FIG. 7A, a substrate 1z such as a silicon substrate with a treated material 2z such as an insulating body formed on the surface thereof is prepared, and an imprint material 3z is then applied to the surface of the treated material 2z by an inkjet method or the like. Here, a situation in which the imprint material 3z in the form of a plurality of liquid droplets has been applied onto the substrate is illustrated.

Figure 7B:
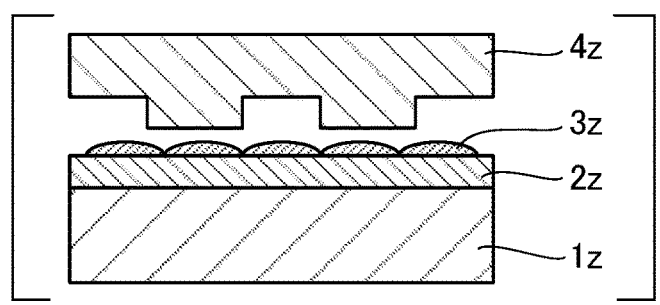
FIG. 7B is a diagram illustrating a state in which an imprint mold has been caused to face an imprint material 3z.
Figure 7C:
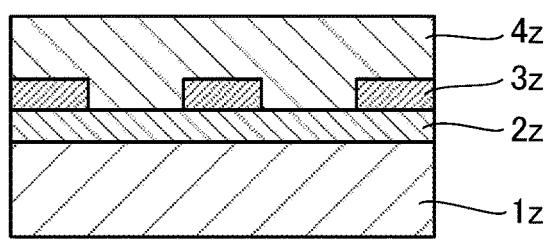
FIG. 7C is a diagram illustrating a state in which the substrate with the imprint material applied thereto and the mold have been brought into contact with each other and a pressure has been applied thereto.

As illustrated in FIG. 7B, a mold 4z for imprint is caused to face the imprint material 3z on the substrate with the side on which the uneven pattern is formed is directed to the imprint material 3z. As illustrated in FIG. 7C, the substrate 1z to which the imprint material 3z has been applied and the mold 4z are brought into contact with each other, and a pressure is applied thereto. A gap between the mold 4z and the treated material 2z is filled with the imprint material 3z. If irradiation with light as an energy for curing is performed through the mold 4z in this state, then the imprint material 3z is cured.

Figure 7D:
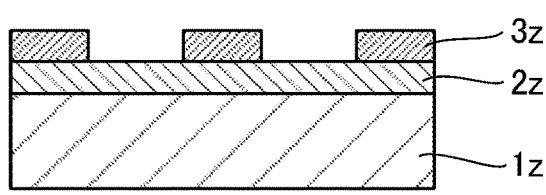
FIG. 7D is a diagram illustrating a state in which the imprint material has been cured and the mold and the substrate have been released from each other.

As illustrated in FIG. 7D, if the mold 4z and the substrate 1z are separated from each other after the imprint material 3z is cured, a pattern of the cured article of the imprint material 3z is formed on the substrate 1z. The pattern of the cured article has a shape in which a recessed portion of the mold corresponds to a projecting portion of the cured article and a projecting portion of the mold corresponds to a recessed portion of the cured article. In other words, the uneven pattern of the mold 4z is transferred to the imprint material 3z.

Figure 7E:
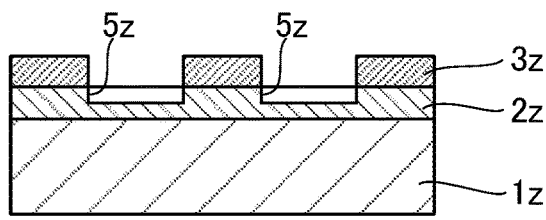
FIG. 7E is a diagram illustrating a state in which etching has been performed using a pattern after the curing as an etching resistant mask.
Figure 7F:
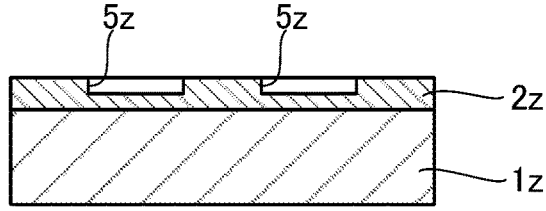
FIG. 7F is a diagram illustrating a state in which an article with a groove formed in a surface of a treated material has been obtained by removing the pattern of the cured article.

As illustrated in FIG. 7E, if etching is performed using the pattern of the cured article as an etching resistant mask, then a portion with no cured article or with a thin cured article remaining is removed from the surface of the treated material 2z, thereby obtaining a groove 5z. As illustrated in FIG. 7F, if the pattern of the cured article is removed, then an article with the groove 5z formed on the surface of the treated material 2z can be obtained. Although the pattern of the cured article is removed here, the pattern may not be removed after treating, and the pattern may be used as a film for interlayer insulation included in a semiconductor element, for example, that is, as a component of the article. Note that although the example in which a mold for transferring a circuit pattern provided with an uneven pattern is used as the mold 4z has been described, a planar template having a planar portion with no uneven pattern may be employed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

Also, a computer program that realizes a part or entirety of the control according to the embodiment and the functions of the aforementioned embodiments may be supplied to an imprint apparatus or the like via a network or various storage media. In addition, a computer (or a CPU, an MPU, or the like) in the imprint apparatus or the like may read and execute the program. In such a case, the program and the storage media storing the program configure the present invention.

This application claims the benefit of Japanese Patent Application No. 2019-181192 filed on Oct. 1, 2019, which is hereby incorporated by reference herein in its entirety.

What is claimed is:

1. An imprint method for forming a pattern on an imprint material supplied onto a substrate using a mold, the method comprising:

performing an adjustment process of adjusting an illumination condition while illuminating a mold mark formed on the mold and a substrate mark formed in a first shot region in a state in which the mold and the imprint material supplied to the first shot region on the substrate are brought into contact with each other;

performing a deriving process of deriving an approximate illumination function indicating an illumination condition for a second shot region on the substrate, wherein the second shot region is different from the first shot region on the substrate, on the basis of the illumination condition for the first shot region adjusted in the adjustment process and a position of the first shot region, wherein the approximate illumination function indicates the illumination condition depending on a position of the second shot region on the substrate; and adjusting the illumination condition for the second shot region on the substrate based on the approximate illumination function and a position of the second shot region on the substrate, wherein the deriving process is performed without illuminating the mold mark and the substrate mark formed in the second shot region on the substrate.

2. The imprint method according to claim 1, wherein the illumination condition includes at least one of a wavelength, a light amount, and a shape of light used for the illumination.

3. The imprint method according to claim 1, wherein images of a pattern of the mold mark and a pattern of the substrate mark are picked up by an image sensor, and the illumination conditions include an imaging period of the image sensor.

4. The imprint method according to claim 1, wherein the predetermined function is set up as a function table.

5. The imprint method according to claim 1, wherein the mold mark and substrate marks of a first shot region and a second shot region of a second substrate in a same lot as a first substrate are illuminated based on the illumination condition for the first shot region in the first substrate and the approximate illumination condition for the second shot region in the first substrate.

6. The imprint method according to claim 1, wherein priming processing of causing the mold to adapt to the imprint material and the first illumination process are performed in parallel.

7. The imprint method according to claim 1, further comprising performing a first positioning process of positioning the mold mark and the substrate mark while adjusting the illumination condition through the first illumination process, for the first shot region.

8. The imprint method according to claim 1, wherein the first illumination process and the deriving process are performed for each of first substrates in different lots.

9. The imprint method according to claim 8, wherein at least the approximate illumination condition of a substrate in another lot is referred to when the approximate illumination condition is derived for each of the first substrates in the different lots.

10. The imprint method according to claim 1, further comprising performing a second illumination process of illuminating the mold mark and the substrate mark on the basis of the approximate illumination condition derived in the deriving process, in a state in which the mold mark formed on the mold is brought into contact with the imprint material supplied onto the substrate mark formed in the second shot region that is different from the first shot regions.

11. The imprint method according to claim 10, wherein the first shot region and the second shot region are located on the same substrate.

12. The imprint method according to claim 10, further comprising performing a second positioning process of positioning the mold mark and the substrate mark under the approximate illumination conditions, for the second shot region.

13. The imprint method according to claim 10, wherein a plurality of shot regions are grouped in accordance with the illumination condition and the approximate illumination condition, and the illumination of the mold mark and the substrate mark and imprint processing are performed for each group.

14. The imprint method according to claim 13, wherein an order of the groups in which the illumination of the mold mark and the substrate mark and the imprint processing are performed is determined in accordance with the illumination conditions and the approximate illumination conditions.

15. The imprint method according to claim 13, wherein the illumination of the mold mark and the substrate mark and the imprint processing are performed on the plurality of shot regions in order of the groups in a direction from a center of the second substrate toward an outer peripheral side or the outer peripheral side to the center.

16. The imprint method according to claim 13, wherein after the imprint material is supplied for each of the groups, the mold mark and the substrate mark in the plurality of shot regions in each of the groups are continuously and successively illuminated.

* * * * *